United States Patent
Kim et al.

(10) Patent No.: US 10,930,879 B2
(45) Date of Patent: Feb. 23, 2021

(54) DISPLAY DEVICE

(71) Applicant: LG Display Co., Ltd., Seoul (KR)

(72) Inventors: JaeHo Kim, Goyang-si (KR);
JongYoung Park, Seoul (KR);
DongKwan Yoo, Pyeongtaek-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/548,769

(22) Filed: Aug. 22, 2019

(65) Prior Publication Data

US 2020/0075886 A1    Mar. 5, 2020

(30) Foreign Application Priority Data

Aug. 31, 2018  (KR) ........................ 10-2018-0103888

(51) Int. Cl.

| | |
|---|---|
| *G06F 1/16* | (2006.01) |
| *H01L 51/52* | (2006.01) |
| *H04N 5/655* | (2006.01) |
| *H05K 5/02* | (2006.01) |
| *H05K 5/00* | (2006.01) |

(52) U.S. Cl.
CPC ......... *H01L 51/5237* (2013.01); *H04N 5/655* (2013.01); *H05K 5/0017* (2013.01); *H05K 5/0204* (2013.01); *H05K 5/0217* (2013.01)

(58) Field of Classification Search
CPC ......... G02F 1/133305; G02F 1/133308; G02F 1/133322; G06F 1/1652; H04M 1/0268
See application file for complete search history.

(56) References Cited

U.S. PATENT DOCUMENTS

| | | | | |
|---|---|---|---|---|
| 9,304,539 | B2* | 4/2016 | Song | G09F 19/02 |
| 9,727,080 | B2* | 8/2017 | Jung | G06F 1/1601 |
| 10,585,310 | B2* | 3/2020 | Ryu | G02B 6/0036 |
| 10,750,625 | B2* | 8/2020 | Park | H05K 1/147 |
| 2013/0207946 | A1* | 8/2013 | Kim | G09G 3/00 345/204 |
| 2013/0321740 | A1* | 12/2013 | An | H05K 5/02 349/58 |
| 2014/0376163 | A1* | 12/2014 | Song | H04N 5/64 361/679.01 |
| 2015/0130775 | A1* | 5/2015 | Kim | G06F 1/1652 345/205 |
| 2015/0192952 | A1* | 7/2015 | Jung | G06F 1/1652 361/747 |

(Continued)

*Primary Examiner* — Anthony Q Edwards
(74) *Attorney, Agent, or Firm* — Polsinelli PC

(57) ABSTRACT

According to an aspect of the present disclosure, a display device includes a display panel, a back cover disposed on a back surface of the display panel and a plurality of curvature changing units which is disposed on a back surface of the back cover and implements curvature of the display panel, the back cover and each of the plurality of curvature changing units includes a pair of curvature implementation bars coupled to the back cover and a distance controller controlling a distance between the pair of curvature implementation bars, and each of the pair of curvature implementation bars includes a fixed coupling unit disposed on an outermost side of the curvature implementation bar and coupled to the back cover at a fixed location; and a plurality of variable coupling units disposed on an inner side of the fixed coupling unit and coupled to the back cover at variable locations.

18 Claims, 11 Drawing Sheets

(56) References Cited

U.S. PATENT DOCUMENTS

2017/0193863 A1* 7/2017 Cho ........................ G06F 1/16
2017/0205658 A1* 7/2017 Jung ...................... H04N 5/64
2017/0347466 A1* 11/2017 Kang ................. H05K 5/0226
2018/0114471 A1* 4/2018 Park ...................... G09F 9/301
2018/0226001 A1* 8/2018 Chen ................ G09F 15/0031

* cited by examiner

DISPLAY DEVICE

CROSS REFERENCE TO RELATED APPLICATION

This application claims the priority of Korean Patent Application No. 10-2018-0103888 filed on Aug. 31, 2018, which is hereby incorporated by reference in its entirety.

BACKGROUND

Field of the Disclosure

The present disclosure relates to a display device, and more particularly, to a display device which can implement a curvature.

Description of the Background

As the information age advances, the field of display device for visually displaying electrical information signals has grown rapidly. Accordingly, various studies on display devices are ongoing to improve the performance such as thinning, weight lightening, and low power consumption. Examples of display devices may include a Liquid Crystal Display device (LCD), a Plasma Display Panel device (PDP), a Field Emission Display device (FED), an Electro-Wetting Display device (EWD), and an Organic Light Emitting Display device (OLED).

Recently, OLEDs are self-emitting display devices and do not need a separate light source. Thus, the OLEDs can be manufactured into a lightweight and thin form. Further, the OLEDs are advantageous in terms of power consumption since they are driven with a low voltage. Also, the OLEDs have excellent color expression ability, a high response speed, a wide viewing angle, and a high contrast ratio (CR). Therefore, the OLEDs have attracted the most attention as next-generation display devices.

The OLEDs have a very small thickness, compared to other display devices and thus can implement the curvature when necessary.

In order to implement the curvature, the OLEDs have needed a large curvature changing structure. However, such a display device with a fixed curvature cannot be changed in curvature when necessary.

SUMMARY

The present disclosure provides a display device with a variable curvature.

The present disclosure provides a display device with a simplified structure for implementing curvature.

The present disclosure is not limited to the above-mentioned aspects, and others, which are not mentioned above, can be clearly understood by those skilled in the art from the following descriptions.

According to an aspect of the present disclosure, a display device is provided. The display device includes a display panel and a back cover disposed on a back surface of the display panel. Further, the display device includes a plurality of curvature changing units which is disposed on a back surface of the back cover and implements the curvature of the display panel and the back cover. Each of the plurality of curvature changing units includes a pair of curvature implementation bars coupled to the back cover and a distance controller controlling a distance between the pair of curvature implementation bars. Each of the pair of curvature implementation bars includes a fixed coupling unit disposed on the outermost side of the curvature implementation bar and coupled to the back cover at a fixed location. Each of the pair of curvature implementation bars also includes a plurality of variable coupling units disposed on an inner side of the fixed coupling unit and coupled to the back cover at variable locations. Thus, it is possible to implement the curvature of the display device.

Other detailed matters of the exemplary aspects are included in the detailed description and the drawings.

According to the present disclosure, it is possible to easily implement the curvature of a display device using a pair of curvature implementation bars which become close to or far from a back surface of a back cover.

According to the present disclosure, a curvature changing unit is composed of a plurality of bars extended in one direction and a turn-buckle. Thus, the display device does not need a large structure for implementing curvature. Therefore, the display device can be transferred readily and placed more efficiently.

According to the present disclosure, even when the curvature is implemented, coupling between the back cover and pem nuts can be maintained without deviation. Thus, the curvature of the display device can be implemented more stably.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
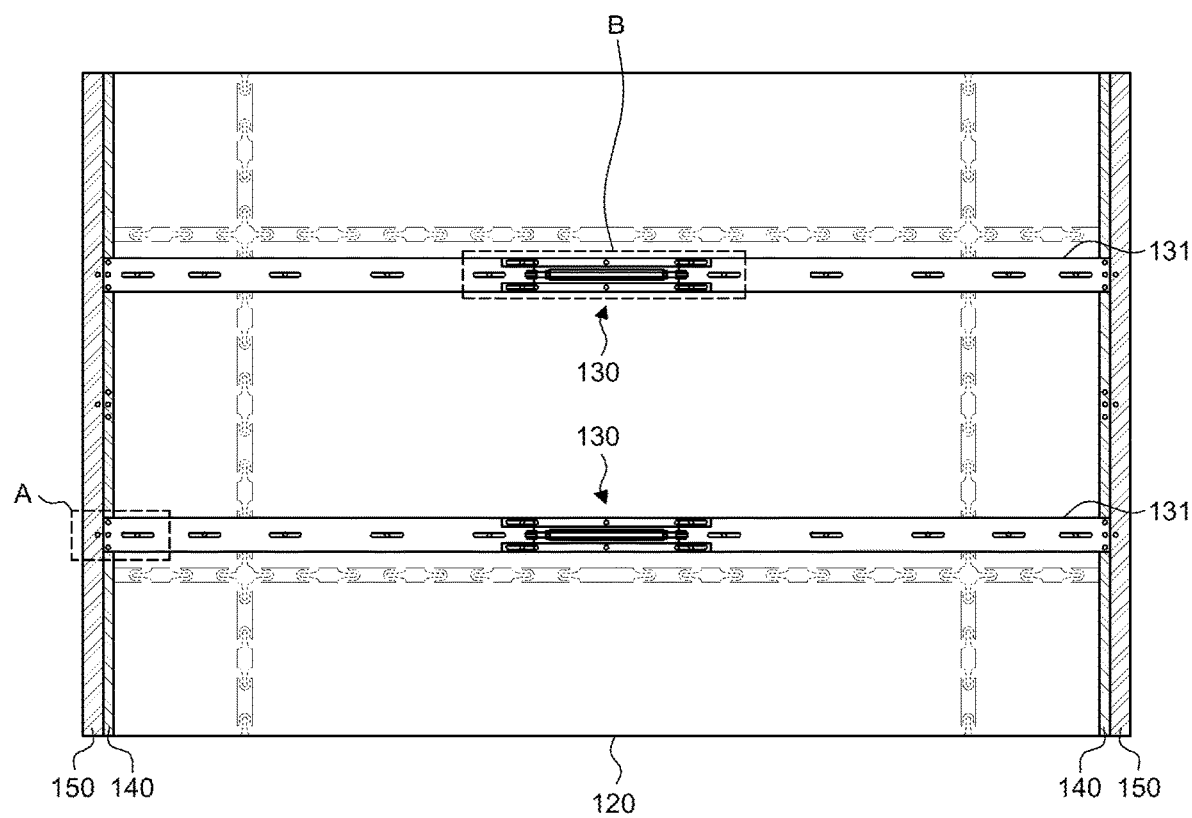
FIG. 1 is a rear view of a display device according to an aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Hereinafter, a display device according to exemplary aspects of the present disclosure will be described in detail with reference to accompanying drawings.

FIG. 1 is a rear view of a display device according to an aspect of the present disclosure.

Figure 2A:
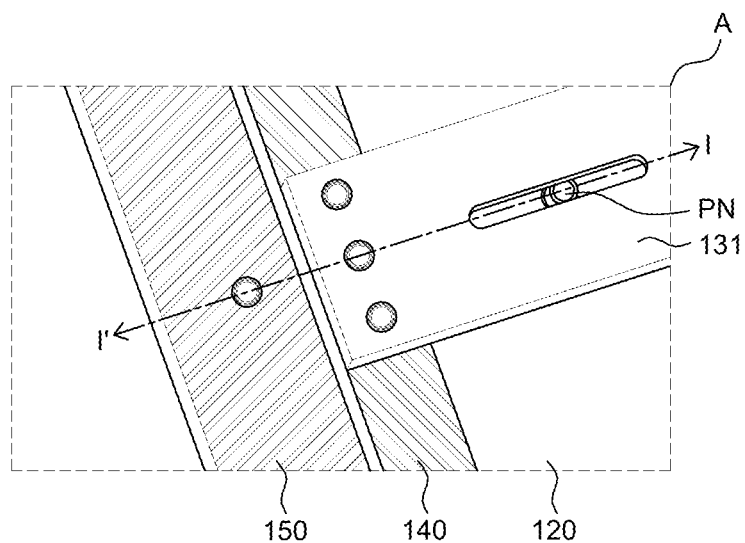
FIG. 2A is provided to explain a coupling relationship in an outer part of the display device according to an aspect of the present disclosure.
Figure 2B:
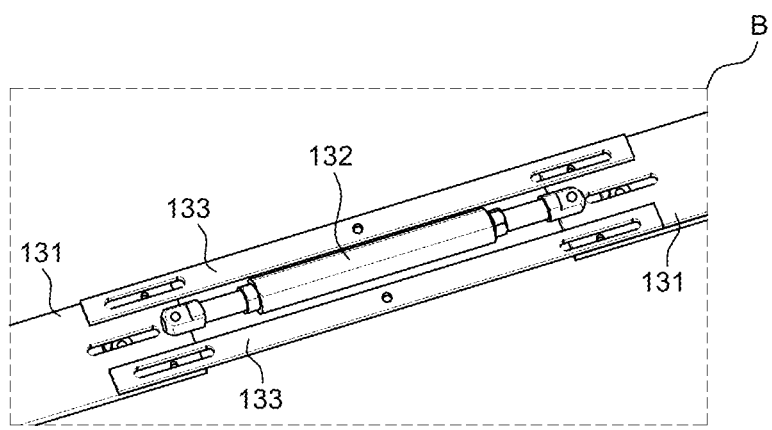
FIG. 2B illustrates a curvature changing unit of the display device according to an aspect of the present disclosure.

FIG. 2A is provided to explain a coupling relationship in an outer part of the display device according to an aspect of the present disclosure. FIG. 2B illustrates a curvature changing unit of the display device according to an aspect of the present disclosure.

Figure 3:
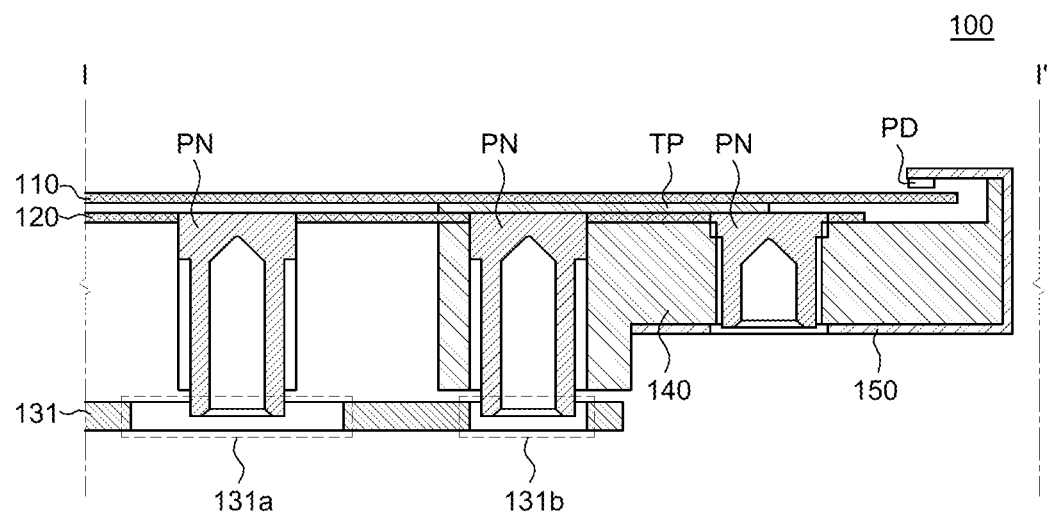
FIG. 3 is a cross-sectional view as taken along a line I-I' shown in FIG. 2A.

FIG. 3 is a cross-sectional view as taken along a line I-I' shown in FIG. 2A.

As shown in FIG. 1 and FIG. 3, a display device 100 according to an aspect of the present disclosure includes a display panel 110 configured to display images and a back cover 120 configured to accommodate the display panel 110. The display device 100 may further include at least one curvature changing unit 130 configured to implement the curvature of the display panel 110 and the back cover 120. The display device 100 may also include a side cabinet 140 configured to fasten the back cover 120 and the at least one curvature changing unit 130 and a side case 150 configured to cover a lateral surface of the display device 100.

Referring to FIG. 2A, a coupling state of the display device 100 including the above-described components will be described below.

Herein, FIG. 2A is provided to explain a coupling relationship in an outer part of the display device according to an aspect of the present disclosure and shows an enlarged view of area A shown in FIG. 1.

The back cover 120 may be bonded to a back surface of the display panel 110 with a double-sided tape TP. The side cabinet 140 may be disposed on a back surface on each side of the back cover 120 and the at least one curvature changing unit 130 may be disposed on back surfaces of the back cover 120 and the side cabinet 140. Then, a plurality of pem nuts PN1 to PN7 (PN) fixed to the back cover 120 may be allowed to pass through the side cabinet 140 and a curvature implementation bar 131 of the at least one curvature changing unit 130 which are sequentially placed. Then, although not illustrated in the drawings, screws may be fastened to back surfaces of the respective pem nuts PN1 to PN7 (PN) to fix the back cover 120, the at least one curvature changing unit 130, and the side cabinet 140.

Further, the side case 150 is coupled to lateral surfaces of the display panel 110, the back cover 120 and the side cabinet 140 which have been coupled to each other to cover the lateral surfaces thereof to fasten the display device 100.

Furthermore, to suppress damage, e.g., erosion and cracks, caused by direct contact between the display panel 110 and the side case 150, a pad PD formed of a buffering material may be disposed on a part of the side case 150 adjacent to the display panel 110.

The pad PD may be formed of polyethylene terephthalate (PET) or may be formed of various other buffering materials.

The display panel 110 is configured to display images. The display panel 110 may be any one of various display panels such as an organic light emitting display panel, a liquid crystal display panel, a field emission display panel, and an electro-wetting display panel. Hereafter, it will be described that a display panel of a display device according to an aspect of the present disclosure is an organic light emitting display panel as an example.

In an aspect of the present disclosure, the display device 100 is configured to implement the curvature. Therefore, the display panel 110 is flexible in order to implement the curvature.

Figure 4:
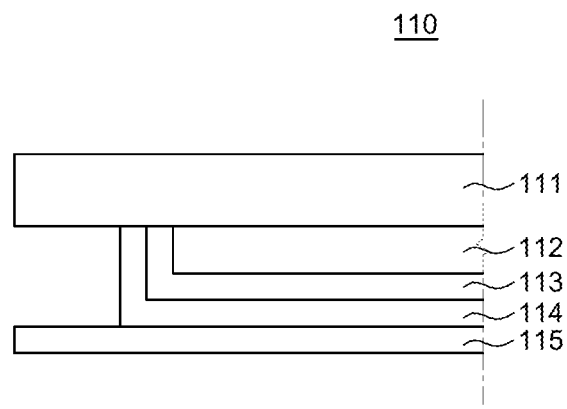
FIG. 4 is a cross-sectional view of a display panel in the display device according to an aspect of the present disclosure.

FIG. 4 is a cross-sectional view of a display panel in the display device according to an aspect of the present disclosure.

Referring to FIG. 4, the display panel 110 of the display device 100 according to an aspect of the present disclosure includes a first substrate 111, an organic light emitting diode 112, a protective layer 113, an adhesive layer 114, and a second substrate 115.

The first substrate 111 may be formed of a transparent rigid material such as glass or may be formed of a transparent flexible material. The organic light emitting diode 112 provided for each unit pixel is disposed on the first substrate 111. Although not illustrated in the drawings, a switch transistor, a drive transistor and at least one capacitor for driving the organic light emitting diode 112 are placed between the first substrate 111 and the organic light emitting diode 112.

The organic light emitting diode 112 includes a first electrode configured to receive a current from a drive transistor (not illustrated) provided for each unit pixel and a second electrode corresponding to the first electrode. The organic light emitting diode 112 further includes an organic layer placed between the first electrode and the second electrode.

The first electrode may be formed of a transparent electrode material, and the second electrode may be formed of a metal material. The organic layer may include an organic emission layer that emits light and an electron injection layer and a hole injection layer that inject electrons and holes into the organic emission layer, respectively. The organic layer may also include an electron transport layer and a hole transport layer that transport the injected electrons and holes to the emission layer, respectively. The organic layer may further include a charge generation layer that generates charges such as electrons and holes.

The organic light emitting diode 112 emits light according to the following mechanism. Holes are injected into the organic layer from the first electrode and transported to the organic emission layer through the hole injection layer and the hole transport layer. Further, electrons are injected into the organic layer from the second electrode and transported to the organic emission layer through the electron injection layer and the electron transport layer. In the organic emission layer, the holes and the electrons are combined into excitons, and light is emitted.

The protective layer 113 for protecting the organic light emitting diode 112 is disposed on an upper surface and a lateral surface of the organic light emitting diode 112. Further, the adhesive layer 114 for bonding the first substrate 111 and the second substrate 115 is disposed on an upper surface and a lateral surface of the protective layer 113. Herein, the adhesive layer 114 may contain a moisture absorbent for absorbing moisture to protect the organic light emitting diode 112 against moisture.

The second substrate 115 opposite to the first substrate 111 is disposed on the adhesive layer 114. The second substrate 115 is an encapsulation plate and may be formed of one of, e.g., glass, metal foil, and plastic film. Herein, the encapsulation plate may also be referred to as an encapsulation substrate.

The display device 100 according to an aspect of the present disclosure has been described as having a structure in which the organic light emitting diode 112 is encapsulated by the protective layer 113 and the adhesive layer 114. However, the present disclosure is not limited thereto. The display device 100 may have an encapsulation structure in which the outer peripheries of the first substrate 111 and the second substrate 115 are coated with an adhesive such as a sealant.

Figure 5A:
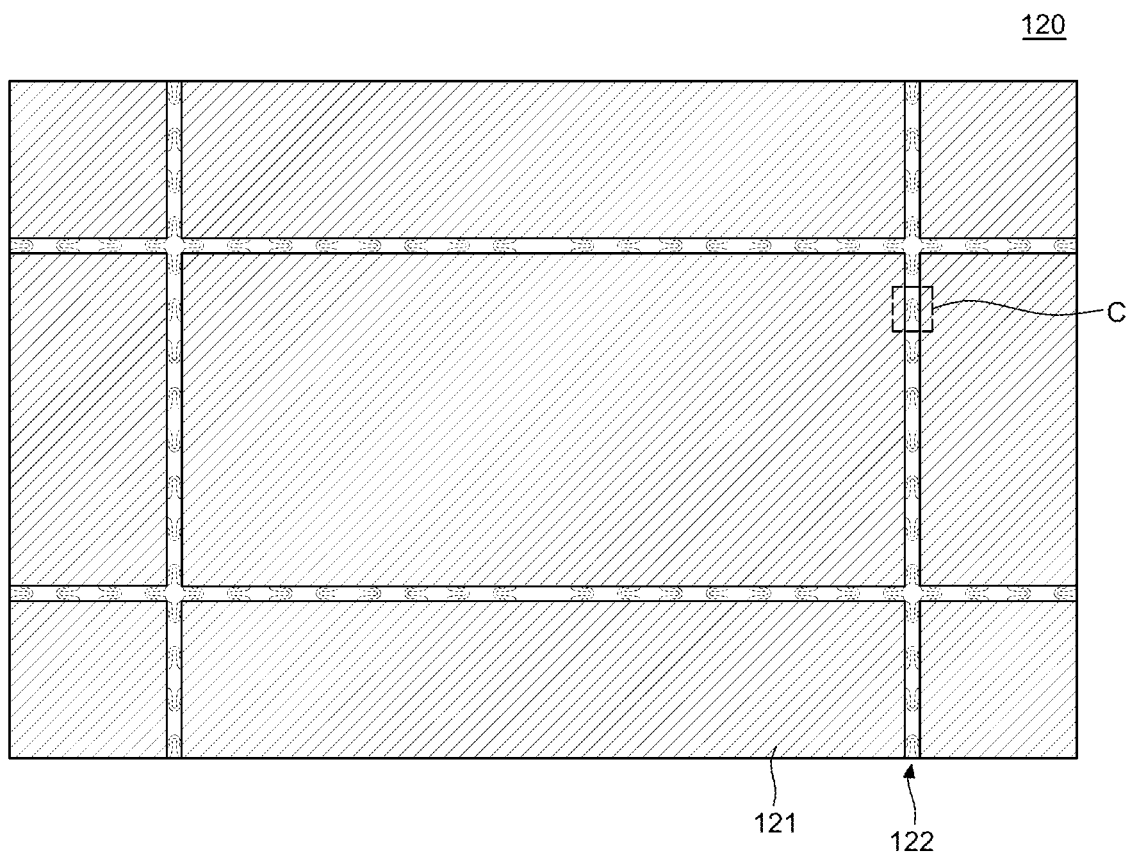
FIG. 5A illustrates a back cover of the display device according to an aspect of the present disclosure.
Figure 5B:
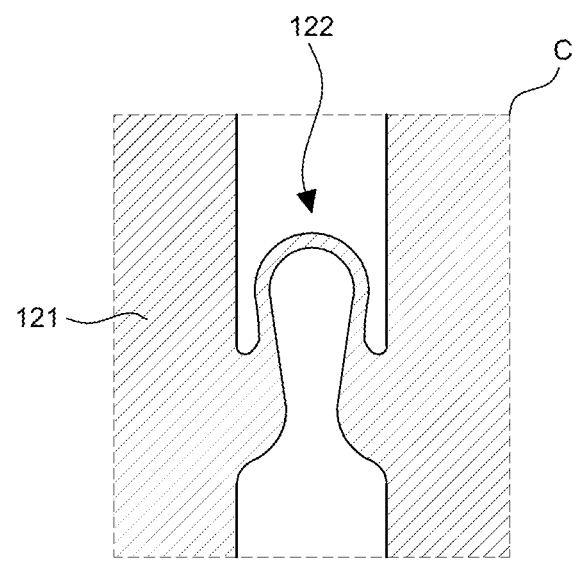
FIG. 5B is an enlarged view of a connection unit provided in the back cover.

FIG. 5A illustrates a back cover of the display device according to an aspect of the present disclosure, and FIG. 5B is an enlarged view of a connection unit provided in the back cover.

In other words, FIG. 5B is an enlarged view of area C of FIG. 5A where a connection unit 122 is placed.

The back cover 120 is configured to accommodate the display panel 110 and may be bonded to a back surface of the second substrate 115 of the display panel 110 with the double-sided tape TP.

In order for the display device of the present disclosure to more efficiently implement the curvature, the back cover 120 may be divided into a plurality of unit plates 121. The plurality of unit plates 121 may be connected by the connection unit 122.

The unit plates 121 may serve to support the display panel 110 and transfer heat generated from the display panel 110 to the outside.

To this end, the unit plates 121 may be formed of any one of aluminum (Al), copper (Cu), zinc (Zn), silver (Ag), gold (Au), and iron (Fe) having high thermal conductivity or may be formed of an alloy of these metals. The unit plates 121 may be formed of aluminum (Al) which has high thermal conductivity and is light in weight and low in cost.

The plurality of unit plates 121 may be divided into identical shapes but may be divided into different shapes as shown in FIG. 5A. The shapes of the unit plates 121 can be changed variously depending on the direction and degree of curvature of the display device 100.

Further, the connection unit 122 serves to connect the plurality of divided unit plates 121 in order for the back cover 120 to flexibly respond to bending stress or compressive stress applied to the unit plates 121.

To this end, the connection unit 122 may be formed into a curved shape, such as Ω, rather than a simple linear shape to absorb stress, as shown in FIG. 5B. The connection unit 122 may be formed of an elastic material rather than the same material as the unit plates 121.

Figure 6A:
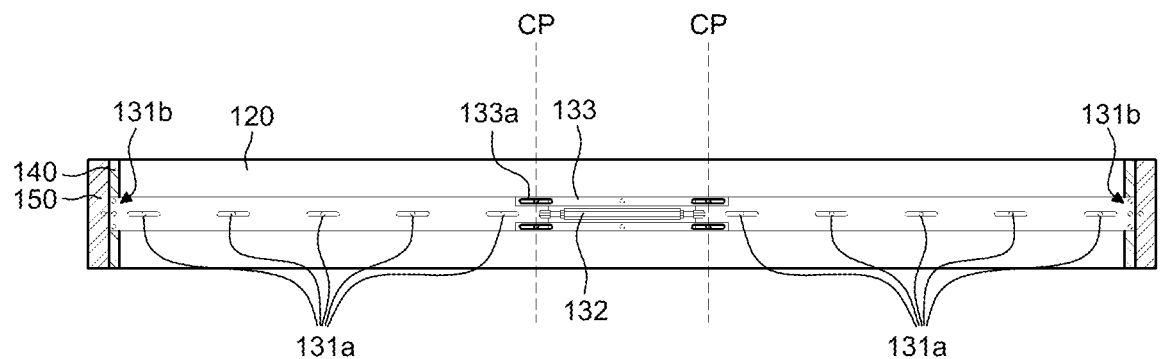
FIG. 6A is a rear view provided to explain the curvature changing unit of the display device and a coupling relationship thereof according to an aspect of the present disclosure.
Figure 6B:
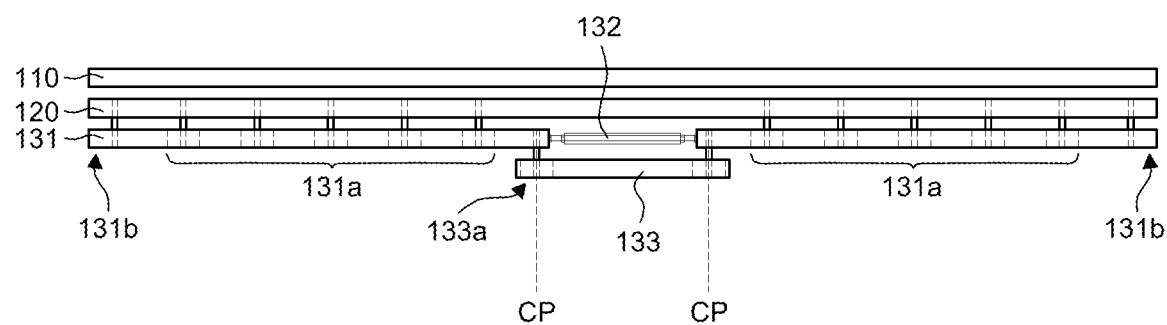
FIG. 6B is a top view provided to explain the display device in a parallel state.

FIG. 6A is a rear view provided to explain the curvature changing unit of the display device and a coupling relationship thereof according to an aspect of the present disclosure. FIG. 6B is a top view provided to explain the display device in a parallel state.

For the convenience of description, FIG. 6A illustrates only one curvature changing unit and some components coupled to the curvature changing unit. Also, FIG. 6B illustrates only a coupling relationship among a display panel, a back cover, and one curvature changing unit.

The curvature changing unit 130 is disposed on a back surface of the back cover 120 and implements the curvature of the display panel 110 and the back cover 120.

As shown in FIG. 1, a plurality of curvature changing units 130 may be disposed in parallel in a horizontal direction on the back surface of the back cover 120. Since the plurality of curvature changing units 130 is disposed in the horizontal direction as such, the horizontal curvature of the display device 100 according to an aspect of the present disclosure can be changed.

Although FIG. 1 illustrates the plurality of curvature changing units 130 disposed in the horizontal direction, the present disclosure is not limited thereto. The curvature changing units 130 may be disposed in various directions as needed for curvature change.

For example, if curvature needs to be changed in both vertical and horizontal directions, any one curvature changing unit 130 may be disposed in the vertical direction and another curvature changing unit 130 may be disposed in the horizontal direction.

Further, referring to FIG. 2B, each of the curvature changing units 130 may include a pair of curvature implementation bars 131 coupled to the back cover 120. Further, each of the curvature changing units 130 may include a distance controller 132 controlling a distance between the pair of curvature implementation bars 131. Also, each of the curvature changing units 130 may include a plurality of fastening bars 133 fixing the locations of the pair of curvature implementation bars 131 whose distance from each other has been determined.

Herein, each of the curvature implementation bars 131 includes a fixed coupling unit 131b disposed on the outermost side of the curvature implementation bar and coupled to the back cover 120 at a fixed location. Further, each of the curvature implementation bars 131 includes first variable coupling units 131a disposed on an inner side of the fixed coupling unit 131b and coupled to the back cover 120 at variable locations.

Specifically, as shown in FIG. 3 and FIG. 5A, the fixed coupling unit 131b may be formed into a circular hole shape. Thus, the pem nuts PN1 to PN7 (PN) fastened to the fixed coupling unit 131b are screwed to fix their fastening locations. Therefore, the outermost side of the curvature implementation bar 131 may be fastened to the outermost side of the back cover 120 at a fixed location.

The first variable coupling unit 131a may have a long hole shape elongated in a horizontal direction in which the curvature implementation bar 131 is extended. Thus, the pem nuts PN1 to PN7 (PN) fastened to the first variable coupling unit 131a are screwed to vary their fastening locations depending on the moving direction and distance of the curvature implementation bar 131. In other words, one ends of the pem nuts PN1 to PN7 (PN) coupled to the back cover 120 are fixed at predetermined locations on the back cover 120. The other ends of the pem nuts PN1 to PN7 (PN) coupled to the first variable coupling unit 131a are changed in their fastening locations as the curvature implementation bar 131 moves.

To be specific, the respective pem nuts PN1 to PN7 (PN) is a coupling structure to which the screw is fastened, and may be a cylindrical structure in which one side is blocked and a hole in which the screw is fastened is formed. Thus, the screw is fastened to the other side of the pem nuts, to fix the back cover 120, the at least one curvature changing unit 130, and the side cabinet 140.

Further, the distance controller 132 may be configured as a turn-buckle coupled to inner ends of the pair of curvature implementation bars 131 and controlling a distance between the pair of curvature implementation bars 131.

The turn-buckle may be formed as extended in one direction and may be disposed to extend in the same direction as the pair of curvature implementation bars 131.

Specifically, the distance controller 132 may control a distance between the pair of curvature implementation bars 131 according to the turn direction of the turn-buckle.

For example, if the turn-buckle serving as the distance controller 132 is turned upwards, the distance between the pair of curvature implementation bars 131 may be decreased. If the turn-buckle serving as the distance controller 132 is turned downwards, the distance between the pair of curvature implementation bars 131 may be increased.

Further, the plurality of fastening bars 133 is disposed in parallel to the turn-buckle and fixes the pair of curvature implementation bars 131 whose distance from each other has been determined. That is, the fastening bars 133 serve to fix the distance between the pair of curvature implementation bars 131.

To this end, the plurality of fastening bars 133 may be extended in the same direction as the pair of curvature implementation bars 131. Further, the plurality of fastening bars 133 may be disposed to partially overlap the pair of curvature implementation bars 131. To fix the pair of curvature implementation bars 131, a second variable coupling unit 133a having a long hole shape elongated in the horizontal direction may be disposed in the overlapped region. That is, the determined distance between the pair of curvature implementation bars 131 can be fixed by screwing at the long hole-shaped second variable coupling unit 133a.

Hereafter, a method of controlling the curvature of the display device according to an aspect of the present disclosure will be described with reference to FIG. 7A through FIG. 8B.

Figure 7A:
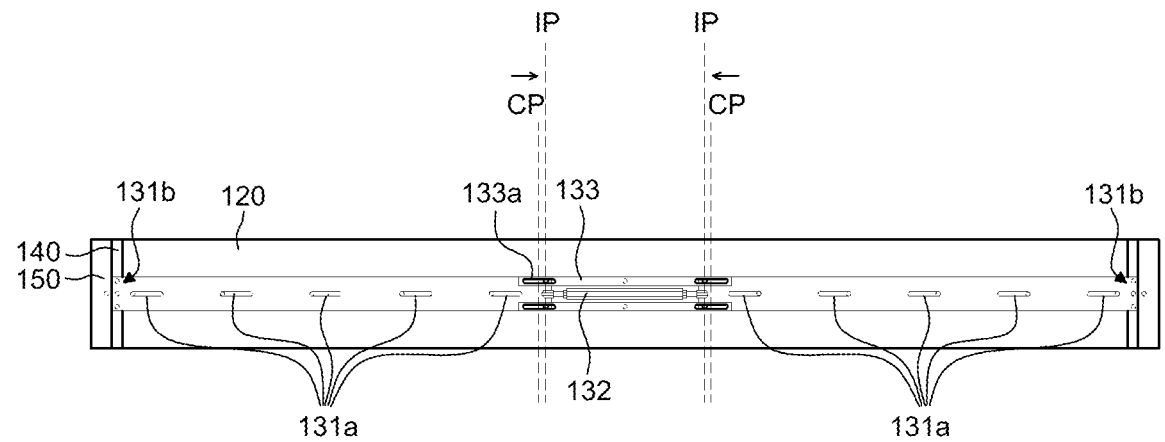
FIG. 7A is a rear view provided to explain the display device according to an aspect of the present disclosure in a convex state.
Figure 7B:
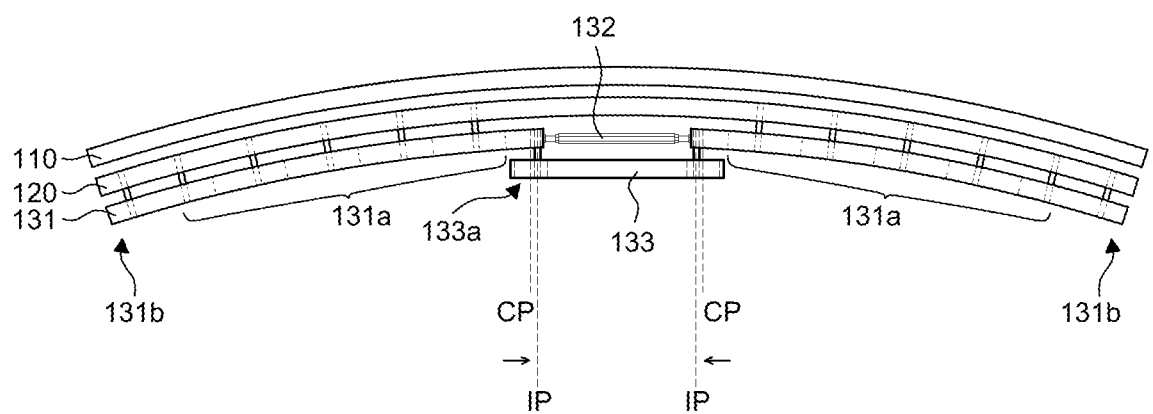
FIG. 7B is a top view provided to explain the display device in the convex state.

FIG. 7A is a rear view provided to explain the display device according to an aspect of the present disclosure in a convex state. FIG. 7B is a top view provided to explain the display device in the convex state.

Figure 8A:
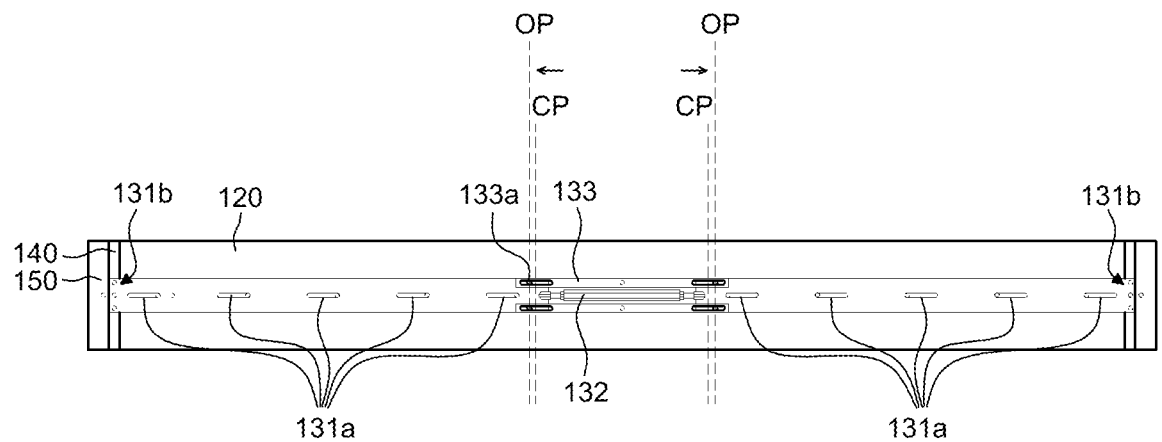
FIG. 8A is a rear view provided to explain the display device according to an aspect of the present disclosure in a concave state.
Figure 8B:
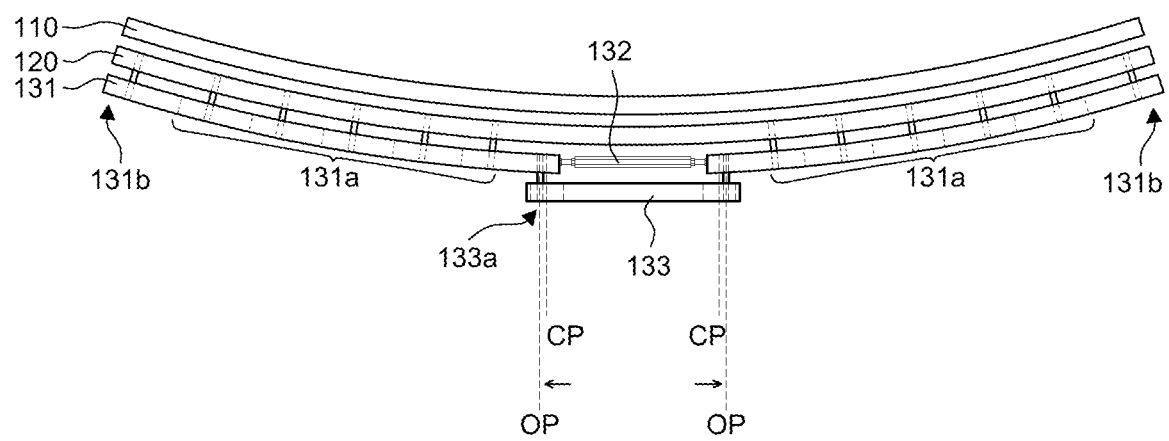
FIG. 8B is a top view provided to explain the display device in the concave state.

FIG. 8A is a rear view provided to explain the display device according to an aspect of the present disclosure in a concave state. FIG. 8B is a top view provided to explain the display device in the concave state.

For the convenience of description, FIG. 7A and FIG. 8A illustrate only one curvature changing unit and some components coupled to the curvature changing unit. Also, FIG. 7B and FIG. 8B illustrate only a coupling relationship among a display panel, a back cover, and one curvature changing unit.

As shown in FIG. 6A and FIG. 6B, in the display device according to an aspect of the present disclosure in a parallel state, the turn-buckle serving as the distance controller 132 is disposed in a parallel state. Thus, the pair of curvature implementation bars 131 is spaced apart at a reference distance.

Further, as shown in FIG. 6A, the pair of curvature implementation bars 131 are spaced apart at the reference distance. Thus, the pair of curvature implementation bars 131 can be fixed by screwing at a central portion CP of the second variable coupling unit 133a of the fastening bar 133. Also, the curvature implementation bars 131 are screwed to the back cover 120 at a central portion of the first variable coupling unit 131a. Thus, the pair of curvature implementation bars 131 can be fixed to the back cover 120.

Thus, as shown in FIG. 6B, the pair of curvature implementation bars 131 are spaced apart at the reference distance by screwing at the central portion CP of the second variable coupling unit 133a. Thus, the curvature implementation bars 131 are not bent. Therefore, the back cover 120 and the display panel 110 fixed to the curvature implementation bars 131 can be maintained in a parallel state.

As shown in FIG. 7A and FIG. 7B, in the display device according to an aspect of the present disclosure, the turn-buckle is disposed as turned in one direction. Thus, the pair of curvature implementation bars 131 is spaced apart at a shorter distance than the reference distance.

In other words, as shown in FIG. 7A, the pair of curvature implementation bars 131 are spaced apart at a shorter distance than the reference distance. Thus, the pair of curvature implementation bars 131 can be fixed while maintaining a shorter distance than the reference distance by screwing at an inner portion IP of the second variable coupling unit 133a of the fastening bar 133. Also, the curvature implementation bars 131 are screwed to the back cover 120 at an inner portion of the first variable coupling unit 131a. Thus, the pair of curvature implementation bars 131 can be fixed to the back cover 120 while maintaining a shorter distance than the reference distance.

Thus, as shown in FIG. 7B, the pair of curvature implementation bars 131 are spaced apart at a shorter distance than the reference distance by screwing at the inner portion IP of the second variable coupling unit 133a. Thus, outer sides of the curvature implementation bars 131 can be bent backwards. Therefore, the back cover 120 and the display panel 110 fixed to the curvature implementation bars 131 are transformed to a convex state.

On the contrary, as shown in FIG. 8A and FIG. 8B, in the display device according to an aspect of the present disclosure, the turn-buckle is disposed as turned in another direction. Thus, the pair of curvature implementation bars 131 is spaced apart at a longer distance than the reference distance.

In other words, as shown in FIG. 8A, the pair of curvature implementation bars 131 are spaced apart at a longer distance than the reference distance. Thus, the pair of curvature implementation bars 131 can be fixed while maintaining a longer distance than the reference distance by screwing at an outer portion OP of the second variable coupling unit 133a of the fastening bar 133. Also, the curvature implementation bars 131 are screwed to the back cover 120 at an outer portion of the first variable coupling unit 131a. Thus, the pair of curvature implementation bars 131 can be fixed to the back cover 120 while maintaining a longer distance than the reference distance.

Thus, as shown in FIG. 8B, the pair of curvature implementation bars 131 are spaced apart at a longer distance than the reference distance by screwing at the outer portion OP of the second variable coupling unit 133a. Thus, the outer sides of the curvature implementation bars 131 can be bent forward. Therefore, the back cover 120 and the display panel 110 fixed to the curvature implementation bars 131 are transformed to a concave state.

After the distance between the pair of curvature implementation bars 131 is adjusted and determined to implement the curvature of the display device, the distance controller 132 may be removed.

As described above, the display device according to an aspect of the present disclosure can easily implement the curvature of the display device using a pair of curvature implementation bars which become close to or far from a back surface of a back cover.

Further, the display device according to an aspect of the present disclosure can implement the curvature of the display device by moving the pair of curvature implementation bars with a removable turn-buckle. Therefore, after the curvature of the display device is implemented, the turn-buckle can be removed, and, thus, the display device can be slim.

Furthermore, in the display device according to an aspect of the present disclosure, a curvature changing unit is composed of a plurality of bars extended in one direction and a turn-buckle. Thus, the display device does not need a large structure for implementing curvature. Therefore, the display device can be transferred readily and placed more efficiently.

Hereafter, a display device according to another aspect of the present disclosure will be described. Another aspect of the present disclosure is different from an aspect of the present disclosure only in the distance between the pem nuts coupled to the back cover. Therefore, only the difference will be explained in detail, but the other same components will not be explained.

Figure 9A:
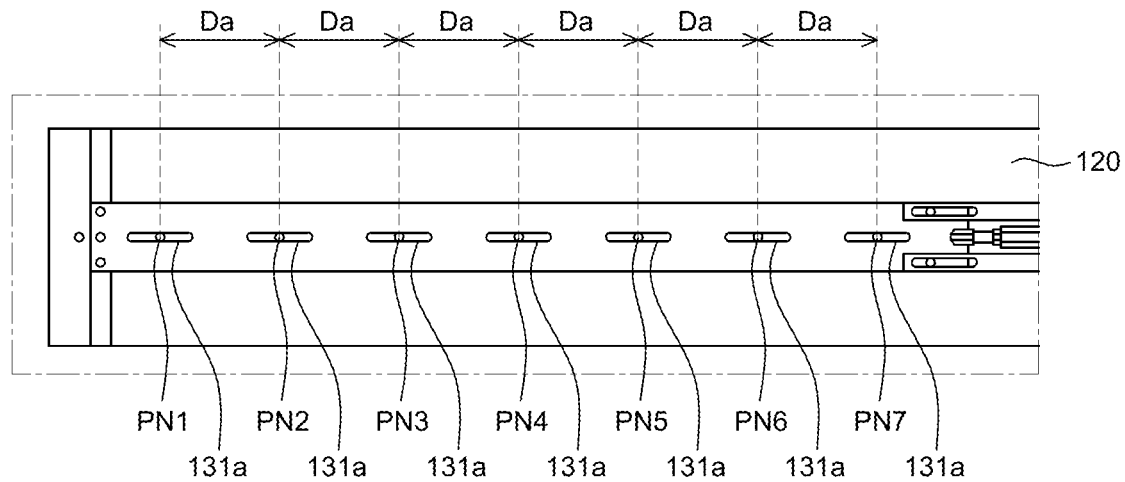
FIG. 9A is provided to explain a case where pem nuts are placed at the same distance from each other in the display device according to an aspect of the present disclosure.
Figure 9B:
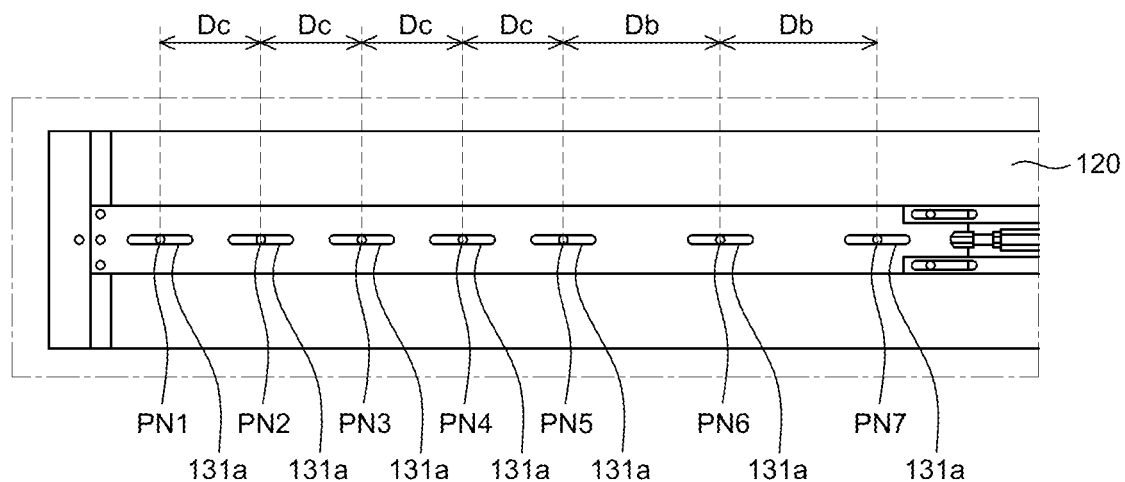
FIG. 9B is provided to explain a case where pem nuts are placed at different distances from each other in a display device according to another aspect of the present disclosure.

FIG. 9A is provided to explain a case where pem nuts are placed at the same distance from each other in the display device according to an aspect of the present disclosure. FIG. 9B is provided to explain a case where pem nuts are placed at different distances from each other in a display device according to another aspect of the present disclosure.

As shown in FIG. 9A, in the display device according to an aspect of the present disclosure, first to seventh pem nuts PN1 to PN7 screwed to the first variable coupling units 131a may be uniformly disposed at a first distance Da.

Herein, the first to seventh pem nuts PN1 to PN7 may include the first pem nut PN1 disposed on the outermost side and the second to seventh pem nuts PN2 to PN7 disposed in sequence in the inward direction of the first pem nut PN1. Therefore, a pem nut disposed on the innermost side may be defined as the seventh pem nut PN7.

In other words, the first to seventh pem nuts PN1 to PN7 may be disposed on the back surface of the back cover 120 while maintaining the first distance Da. The first to seventh pem nuts PN1 to PN7 may be screwed to the first variable coupling units 131a to fix the back cover 120 and the pair of curvature implementation bars 131.

Meanwhile, when the curvature is implemented in the display device according to an aspect of the present disclosure, an outer side of the display device may be applied with more bending stress than an inner side of the display device. That is, when the curvature is implemented in the display device, there is a tendency that the strongest stress is applied to a coupling portion between the first pem nut PN1 and the back cover 120 and the weakest stress is applied to a coupling portion between the seventh pem nut PN7 and the back cover 120.

In this case, since the coupling portion between the first pem nut PN1 and the back cover 120 is applied with strong stress, the first pem nut PN1 and the back cover 120 in the display device whose curvature has been implemented may not maintain the coupling and may deviate. Therefore, the mechanical reliability of the display device may be degraded.

Therefore, in the display device according to another aspect of the present disclosure, a distance between pem nuts disposed on an outer side of the display device is decreased and a distance between pem nuts disposed on an inner side of the display device is relatively increased. That is, the pem nuts on the outer side of the display device are disposed densely to disperse stress applied to the pem nuts on the outer side of the display device when the curvature of the display device is implemented.

That is, as shown in FIG. 9B, a distance between the fifth to seventh pem nuts PN5 to PN7 disposed on the inner side of the display device and coupled to the back cover 120 may be set to a second distance Db which is longer than the first distance Da. Further, a distance between the first to fifth pem nuts PN1 to PN5 disposed on the outer side of the display device and coupled to the back cover 120 may be set to a third distance Dc which is shorter than the first distance Da.

For example, in an aspect of the present disclosure as shown in FIG. 9A, the first to seventh pem nuts PN1 to PN7 can be uniformly disposed at the first distance Da of, e.g., 73.3 mm. However, in another aspect of the present disclosure as shown in FIG. 9B, the first to fifth pem nuts PN1 to PN5 on the outer side of the display panel may be disposed at the third distance Dc of, e.g., 60 mm. Further, the fifth to seventh pem nuts PN5 to PN7 on the inner side of the display panel may be disposed at the second distance Db of, e.g., 100 mm.

Hereafter, stress applied to coupling portions of the respective first to seventh pem nuts PN1 to PN7 according to an aspect and another aspect of the present disclosure when the radius of curvature of a display device is set to 1000 R will be described with reference to Table 1.

In Table 1, Comparative Example represents an aspect of the present disclosure and Example represents another aspect of the present disclosure for the convenience of description.

TABLE 1

| | | | Pem nut No. | | | | [Unit: MPa] |
|---|---|---|---|---|---|---|---|
| Stress | 1 | 2 | 3 | 4 | 5 | 6 | 7 |
| Example | 28.3 | 26.8 | 23.6 | 17.7 | 20.3 | 21.4 | 21.6 |
| Comparative Example | 31.6 | 27.3 | 24.5 | 18.1 | 18.3 | 18.6 | 20.1 |

Table 1 shows stress applied to coupling portions of the first pem nut PN1 and the second pem nut PN2 disposed on the outer side of the display device. Specifically, in Comparative Example, i.e., an aspect of the present disclosure, stress applied to the coupling portion of the first pem nut PN1 was 31.6 MPa and stress applied to the coupling portion of the second pem nut PN2 was 27.3 MPa. In Example, i.e., another aspect of the present disclosure, stress applied to the coupling portion of the first pem nut PN1 was measured as 28.3 MPa and stress applied to the coupling portion of the second pem nut PN2 was measured as 26.8 MPa.

That is, as in another aspect of the present disclosure, stress applied to each of the pem nuts on the outer side of the display device can be reduced by decreasing a distance between the pem nuts and thus increasing the density of the pem nuts. Therefore, even when the curvature is implemented in the display device of another aspect of the present disclosure, coupling between the back cover and the pem nuts can be maintained without deviation. Thus, the curvature of the display device can be implemented more stably.

Hereafter, a display device according to yet another aspect of the present disclosure will be described. Yet another aspect of the present disclosure is different from an aspect of the present disclosure only in the configuration of a distance controller. Therefore, only the difference will be explained in detail, but the other same components will not be explained.

Figure 10:
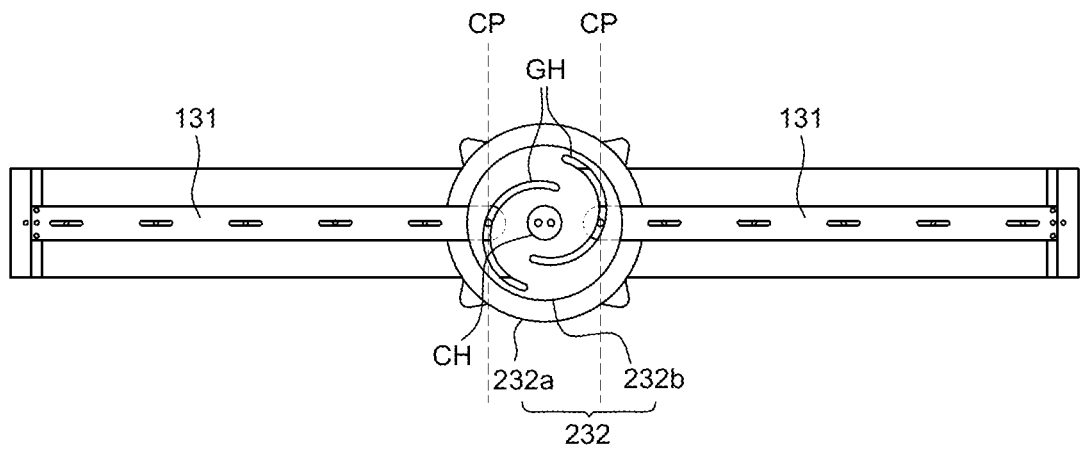
FIG. 10 through FIG. 12 are provided to explain an operation of a distance controller of a display device according to yet another aspect of the present disclosure.
Figure 11:
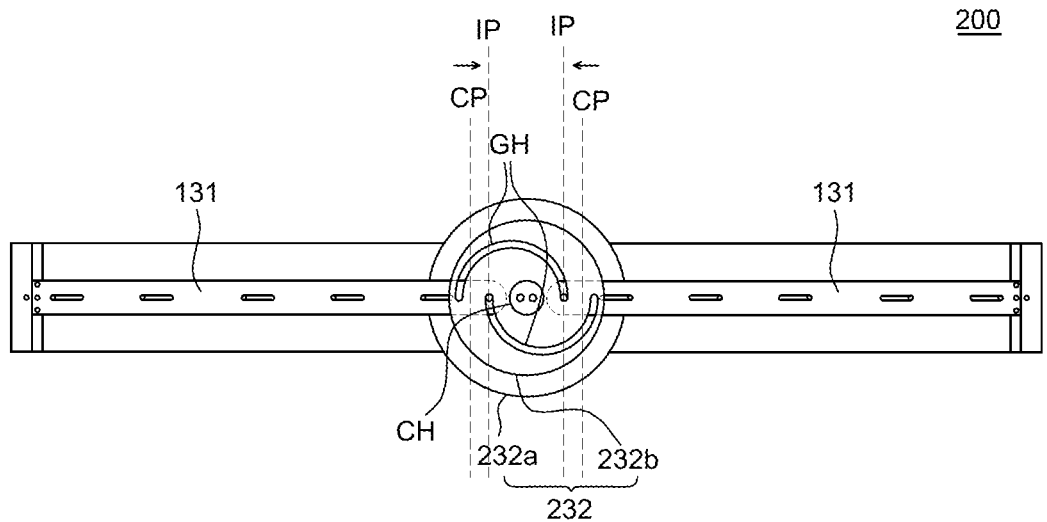
Figure 12:
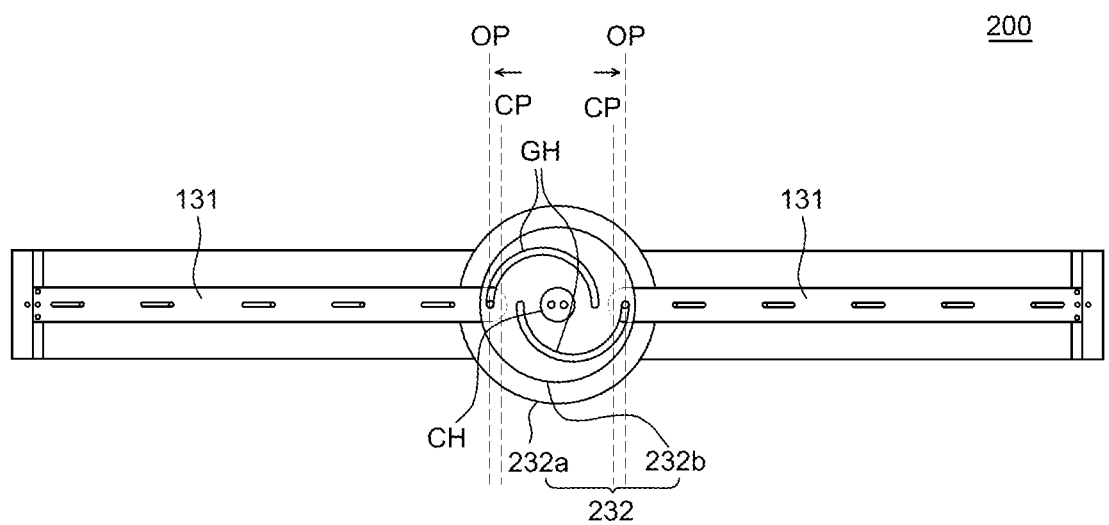

FIG. 10 through FIG. 12 are provided to explain an operation of a distance controller of a display device according to yet another aspect of the present disclosure.

Specifically, FIG. 10 illustrates an operation of the distance controller of the display device according to yet another aspect of the present disclosure in a parallel state. FIG. 11 illustrates an operation of the distance controller of the display device according to yet another aspect of the present disclosure in a convex state. Further, FIG. 12 illustrates an operation of the distance controller of the display device according to yet another aspect of the present disclosure in a concave state.

As shown in FIG. 10, a distance controller 232 of the display device according to yet another aspect of the present disclosure may include a cam.

Specifically, the distance controller 232 of the display device according to yet another aspect of the present disclosure may include an outer case 232a including a plurality of protrusions that enables a user to directly turn the distance controller 232. Further, the distance controller 232 of the display device according to yet another aspect of the present disclosure may include a cam 232b including guide holes GH that control a distance between the pair of curvature implementation bars 131.

Herein, each of the outer case 232a and the cam 232b may have a circular shape, and the outer case 232a may be coupled to the cam 232b through a contact hole CH at the center of the cam 232b.

Further, the cam 232b may include the guide holes GH that control a distance between the pair of curvature implementation bars 131. Herein, distances between respective points of the guide holes GH and the center of the cam 232b are not uniform and can be varied.

Further, as shown in FIG. 10, the cam 232b includes a plurality of guide holes GH disposed symmetrically, and, thus, the pair of curvature implementation bars 131 coupled to the guide holes GH can be moved in a horizontal direction.

Specifically, as shown in FIG. 11, in the display device according to yet another aspect of the present disclosure in a convex state, the cam 232b is turned counterclockwise. Thus, the pair of curvature implementation bars 131 is screwed at the inner portion IP and thus can be fixed while maintaining a shorter distance than the reference distance. Thus, outer sides of the curvature implementation bars 131 can be bent backwards. Therefore, a back cover and a display panel fixed to the curvature implementation bars 131 are transformed to a convex state.

On the contrary, as shown in FIG. 12, in the display device according to yet another aspect of the present disclosure in a concave state, the cam 232b is turned clockwise. Thus, the pair of curvature implementation bars 131 is screwed at the outer portion OP and thus can be fixed while maintaining a longer distance than the reference distance. Thus, the outer sides of the curvature implementation bars 131 can be bent forward. Therefore, the back cover and the display panel fixed to the curvature implementation bars 131 are transformed to a concave state.

As described above, the display device according to yet another aspect of the present disclosure can use a cam instead of a turn-buckle to control a distance between a pair of curvature implementation bars.

The exemplary aspects of the present disclosure can also be described as follows:

According to an aspect of the present disclosure, there is provided a display device. includes a display panel, a back cover disposed on a back surface of the display panel and a plurality of curvature changing units which is disposed on a back surface of the back cover and implements curvature of the display panel, the back cover and each of the plurality of curvature changing units includes a pair of curvature implementation bars coupled to the back cover and a distance controller controlling a distance between the pair of curvature implementation bars, and each of the pair of curvature implementation bars includes a fixed coupling unit disposed on an outermost side of the curvature implementation bar and coupled to the back cover at a fixed location; and a plurality of variable coupling units disposed on an inner side of the fixed coupling unit and coupled to the back cover at variable locations.

The plurality of curvature changing units may be placed in parallel to each other.

The variable coupling unit may have a long hole shape elongated in the same direction as the pair of curvature implementation bars.

The back cover may include a plurality of pem nuts placed in the plurality of variable coupling units, respectively, and the plurality of pem nuts may be equally spaced apart from each other.

The back cover may include a plurality of pem nuts placed in the plurality of variable coupling units, respectively, and a plurality of pem nuts disposed on an outer side of the back cover may be placed more densely than a plurality of pem nuts disposed on an inner side of the back cover.

The distance controller may be configured as a turn-buckle.

Each of the plurality of variable coupling units may further include at least one fastening bar placed in parallel to the turn-buckle and fixing the distance between the pair of curvature implementation bars.

The display panel may be an organic light emitting display panel.

When the distance between the pair of curvature implementation bars is increased, the display panel and the back cover may be transformed to a concave state.

When the distance between the pair of curvature implementation bars is decreased, the display panel and the back cover may be transformed to a convex state.

The back cover may include a plurality of divided unit plates and a connection unit connecting the plurality of divided unit plates.

The connection unit has an "Ω" shape.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
    a display panel;
    a back cover disposed on a back surface of the display panel; and
    a plurality of curvature changing units which is disposed on a back surface of the back cover and implements a curvature of the display panel and the back cover,
    wherein each of the plurality of curvature changing units comprises:
    a pair of curvature implementation bars coupled to the back cover; and
    a distance controller controlling a distance between the pair of curvature implementation bars, and
    wherein each of the pair of curvature implementation bars comprises:
    a fixed coupling unit disposed on an outermost side of the curvature implementation bar and coupled to the back cover at a fixed location;
    a plurality of variable coupling units disposed on an inner side of the fixed coupling unit and coupled to the back cover at variable locations, and
    wherein the back cover comprises:
    a plurality of divided unit plates; and
    a connection unit connecting the plurality of divided unit plates.

2. The display device according to claim 1, wherein the plurality of curvature changing units is placed in parallel to each other.

3. The display device according to claim 1, wherein the plurality of variable coupling unit has a long hole shape elongated in the same direction as the pair of curvature implementation bars.

4. The display device according to claim 1, wherein the back cover comprises a plurality of pem nuts placed in the plurality of variable coupling units, respectively, and
    wherein the plurality of pem nuts is equally spaced apart from each other.

5. The display device according to claim 1, wherein the back cover comprises:
    a plurality of pem nuts placed in the plurality of variable coupling units, respectively, and
    a plurality of pem nuts disposed on an outer side of the back cover is placed more densely than a plurality of pem nuts disposed on an inner side of the back cover.

6. The display device according to claim 1, wherein the distance controller is configured as a turn-buckle.

7. The display device according to claim 6, wherein each of the plurality of variable coupling units further includes at least one fastening bar placed in parallel to the turn-buckle and fixing the distance between the pair of curvature implementation bars.

8. The display device of claim 1, wherein the distance controller is configured as a cam including guide holes that control the distance between the pair of curvature implementation bars.

9. The display device according to claim 1, wherein display panel and the back cover are transformed in a concave state when the distance between the pair of curvature implementation bars is increased.

10. The display device according to claim 1, wherein the display panel and the back cover are transformed in a convex state when the distance between the pair of curvature implementation bars is decreased.

11. The display device according to claim 1, wherein the connection unit has an "Ω" shape.

12. A display device having a display panel, comprising:
    a back cover disposed on a back surface of the display panel; and
    a plurality of curvature changing units disposed on a back surface of the back cover and changing a curvature of the display panel and the back cover between 0 and 1,
    wherein each of the plurality of curvature changing units placed in parallel to each other comprises a pair of curvature changing bars coupled to the back cover; and
    a distance controller controlling a distance between the pair of curvature implementation bars,
    wherein each of the pair of curvature implementation bars comprises a fixed coupling unit disposed on an outermost side of the curvature implementation bar and coupled to the back cover at a fixed location, and a plurality of variable coupling units disposed on an inner side of the fixed coupling unit and coupled to the back cover at variable locations, and
    wherein the back cover comprises a plurality of pem nuts placed in the plurality of variable coupling units, and a plurality of pem nuts disposed on an outer side of the back cover is placed more densely than a plurality of pem nuts disposed on an inner side of the back cover.

13. The display device according to claim 12, wherein the plurality of variable coupling unit has a long hole shape elongated in the same direction as the pair of curvature implementation bars.

14. The display device of claim 12, wherein the distance controller is configured as turn-buckle or a cam including guide holes that control the distance between the pair of curvature implementation bars.

15. The display device according to claim 14, wherein each of the plurality of variable coupling units further comprises at least one fastening bar placed in parallel to the turn-buckle and fixing the distance between the pair of curvature implementation bars.

16. The display device according to claim 12, wherein display panel and the back cover are transformed in a concave state when the distance between the pair of curvature implementation bars is increased and in a convex state when the distance between the pair of curvature implementation bars is decreased.

17. The display device according to claim 12, wherein the back cover comprises:
- a plurality of divided unit plates; and
- a connection unit connecting the plurality of divided unit plates.

18. The display device according to claim 17, wherein the connection unit has an "Ω" shape.

* * * * *